United States Patent
Du

(10) Patent No.: US 9,885,815 B2
(45) Date of Patent: Feb. 6, 2018

(54) INTEGRATED BIREFRINGENT GRIDLESS WAVELENGTH LOCKER

(71) Applicant: Finisar Corporation, Sunnyvale, CA (US)

(72) Inventor: Tengda Du, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 286 days.

(21) Appl. No.: 14/525,054

(22) Filed: Oct. 27, 2014

(65) Prior Publication Data

US 2016/0116655 A1    Apr. 28, 2016

(51) Int. Cl.
| | |
|---|---|
| G02B 5/30 | (2006.01) |
| H01S 5/068 | (2006.01) |
| H01S 5/0687 | (2006.01) |
| G01J 1/42 | (2006.01) |
| H01S 5/024 | (2006.01) |

(52) U.S. Cl.
CPC .......... *G02B 5/3083* (2013.01); *G01J 1/4228* (2013.01); *H01S 5/068* (2013.01); *H01S 5/0687* (2013.01); *H01S 5/02415* (2013.01)

(58) Field of Classification Search
CPC ..... G02B 5/3083; H01S 5/0687; H01S 3/005; H01S 5/005; H01S 5/065; H01S 5/0651; H01S 5/068; H01S 5/0683; H01S 5/02415; G01J 1/4228; G01J 1/4257; G01J 2001/4238
USPC ............. 250/216, 225, 205, 201.1; 359/260; 356/365
See application file for complete search history.

(56) References Cited

U.S. PATENT DOCUMENTS

| | | | |
|---|---|---|---|
| 3,183,763 A * | 5/1965 | Koester | G01N 21/21 356/33 |
| 4,890,922 A | 1/1990 | Wilson | |
| 5,040,896 A | 8/1991 | Moslehi | |
| 6,130,778 A * | 10/2000 | Iwatsuka | G02B 5/3083 359/484.03 |
| 7,962,044 B2 * | 6/2011 | McCallion | G02B 6/4201 356/454 |
| 2002/0191291 A1 * | 12/2002 | Zhao | G02B 26/06 359/489.04 |

(Continued)

FOREIGN PATENT DOCUMENTS

| | | |
|---|---|---|
| EP | 0712183 A2 | 5/1996 |
| EP | 1182436 A1 | 2/2002 |

OTHER PUBLICATIONS

Invitation mailed Jan. 26, 2016 in International Application No. PCT/US2015/057657, 6 pgs.

(Continued)

*Primary Examiner* — Que T Le
*Assistant Examiner* — Jennifer Bennett
(74) *Attorney, Agent, or Firm* — Maschoff Brennan

(57) ABSTRACT

A wavelength locker for use with tunable optical devices may include an etalon, a polarization beam splitter, and a first and second detector. The etalon may be positioned to receive a first beam and may include a first birefringent crystal having a first optical axis and a second birefringent crystal having a second optical axis. The first birefringent crystal may be coupled to the second birefringent crystal such that the first optical axis and the second optical axis are orthogonal to one another.

19 Claims, 3 Drawing Sheets

(56) References Cited

U.S. PATENT DOCUMENTS

| | | | |
|---|---|---|---|
| 2003/0021308 A1* | 1/2003 | Kuznetsov | G01J 9/0246 372/32 |
| 2004/0105098 A1* | 6/2004 | Rella | G01J 9/0246 356/519 |
| 2005/0051712 A1* | 3/2005 | Komiyama | G01J 9/00 250/225 |
| 2008/0049316 A1* | 2/2008 | Nakamoto | H01S 5/0687 359/489.07 |
| 2008/0175597 A1* | 7/2008 | Arahira | H04L 7/0075 398/152 |
| 2013/0258453 A1* | 10/2013 | Arahira | G02F 1/39 359/330 |

OTHER PUBLICATIONS

International Search Report and Written Opinion dated Apr. 7, 2016, in related PCT Application No. PCT/US2015/057657 (15 pages).

* cited by examiner

INTEGRATED BIREFRINGENT GRIDLESS WAVELENGTH LOCKER

BACKGROUND

1. Field

Embodiments disclosed herein relate to optical components. In particular, some embodiments described herein relate to wavelength lockers suitable for use with tunable lasers.

2. Related Technology

Laser frequency monitoring and locking is an essential technology in a variety of diverse applications, including telecommunications, medical devices, and optical computing. For example, optimization of a dense wavelength division multiplexing (DWDM) system requires precise control and accurate tuning of the frequencies transmitted along an optical fiber by a laser. In DWDM systems, each laser signal is tuned in frequency to a discrete channel, allowing a plurality of signals to be simultaneously transmitted in a single fiber and therefore enabling a large volume of information to be transmitted through a single fiber. Each of these lasers may be locked to a wavelength locker to ensure that it remains tuned to its proper channel, regardless of any environmental or systematic factors. The communication channels are defined on a grid with equal frequency spacing in a band at approximately 194 THz (the ITU grid).

A wavelength locker provides a calibrated reference for determining the wavelength deviation of a laser output from a desired wavelength (e.g., an ITU communications channel), which is used to tune the laser wavelength back to the desired wavelength. Thus, wavelength lockers are critical to optical communication systems because they enable more closely-spaced channels, thereby increasing the bandwidth of the system.

For optical communication systems where the communications channels must be spaced equally apart in frequency, an interferometric optical element, such as a Fabry-Perot (FP) etalon, is commonly used as the reference element of a wavelength locker. An FP etalon is composed of two partially-reflecting mirrors that are substantially parallel and separated by a gap. The wavelength locker matches the Free Spectral Range (FSR) of the etalon to the frequency spacing of the ITU grid such that the FP etalon acts as a reference to indicate where the ITU channels are located.

In some optical communication systems, gridless tuning may be desirable. Gridless tuning enables a user or operator to tune an optical source to intermediate wavelengths within the ITU grid, as well as wavelengths beyond the ITU grid and/or the wavelengths of the ITU grid itself. Gridless tuning may therefore enable a user or operator to continuously tune an optical source to any wavelength in a wavelength range that may include one or more ITU grid wavelengths and/or other wavelengths of interest. One approach to achieving gridless tuning has been the use of a specialized double etalon assembly having two resonators disposed in a side-by-side configuration such that the etalons are offset by a specified fraction of their respective FSR. However, the required difference in thickness (approximately 1 or 2 micrometers) between the two etalons can create manufacturing difficulties. Furthermore, crosstalk issues between the two etalons may arise if the etalons are not separated a sufficient distance apart from one another, and the required gap between the two etalons increases the overall size of the wavelength locker.

Another approach to achieving gridless tuning has been the use of a single etalon with a thermoelectric cooler (TEC) which can tune the optical source by adjusting the operating temperature of the optical source. Upon achieving the desired wavelength, the TEC may maintain its temperature to lock the wavelength of the optical source. However, use of temperature-controlled tuning may be inaccurate and mechanically unstable, and may require high power consumption.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

An example embodiment may include an etalon for use in a gridless wavelength locker. The etalon may include a first birefringent crystal having a first optical axis and a second birefringent crystal having a second optical axis. The first birefringent crystal may be coupled to the second birefringent crystal such that the first optical axis and the second optical axis are orthogonal to one another.

Another example embodiment may include an optical transmitter having an optical light source configured to emit an output beam. A first beam splitter may be positioned in a beam path of the output beam and may be configured to split the output beam into a first beam and a second beam. A waveplate may be positioned in a beam path of the second beam and may be configured to polarize the second beam to generate a third beam having a linear polarization of approximately 45 degrees. An etalon may be positioned in a beam path of the third beam, and may include a first birefringent crystal having a first optical axis and a second birefringent crystal having a second optical axis. The first and second birefringent crystals may be coupled together such that the first optical axis and the second optical axis are orthogonal to one another.

Another example embodiment may include a method of wavelength locking. The method may include transmitting a first beam that includes both a horizontal polarization component and a vertical polarization component through an etalon. The etalon may include a first birefringent crystal having a first optical axis and a second birefringent crystal having a second optical axis. The first and second birefringent crystals may be coupled together such that the first optical axis and the second optical axis are orthogonal to one another. Transmitting the first beam through the etalon may include delaying the horizontal polarization component by a first delay and delaying the vertical polarization component by a second delay that is different than the first delay. The method may also include generating a first signal that represents a first power of the delayed horizontal polarization component and generating a second signal that represents a second power of the delayed vertical polarization component. The method may further include determining a wavelength of the first beam based on a ratio of the first signal and the second signal or based on a ratio of a normalized first signal and a normalized second signal.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Particular embodiments of the present disclosure will be described with reference to the accompanying drawings. The illustrative embodiments described in the detailed description, drawings, and claims are not meant to be limiting. Other embodiments may be utilized, and other changes may be made, without departing from the spirit or scope of the subject matter presented herein. The aspects of the present disclosure, as generally described herein, and illustrated in the Figures, can be arranged, substituted, combined, separated, and designed in a wide variety of configurations, all of which are explicitly contemplated herein.

Embodiments of the present disclosure will now be explained with reference to the accompanying figures.

Figure 1:
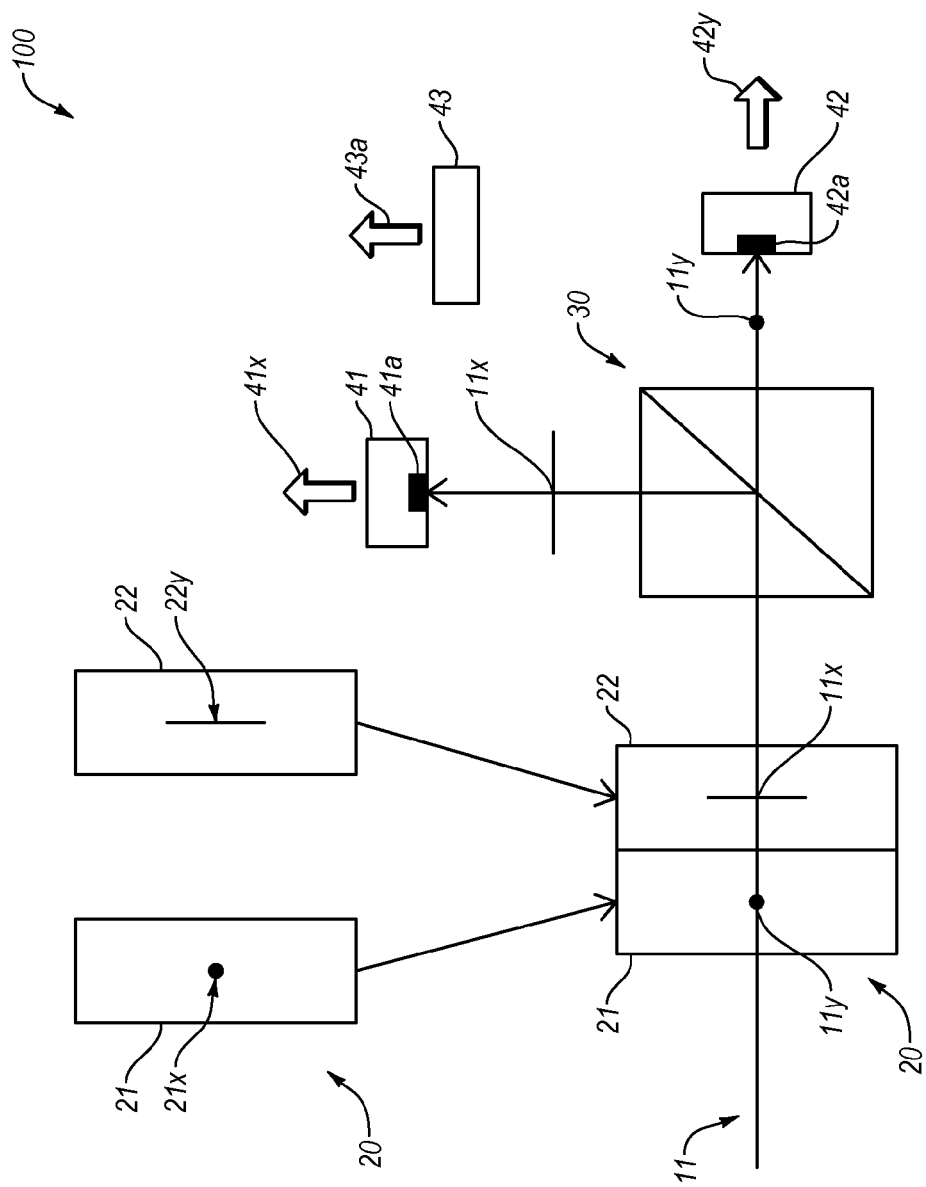
FIG. 1 illustrates a schematic view of a wavelength locker that includes an etalon, a beam splitter, first and second detectors, and a reference detector.

FIG. 1 illustrates an example wavelength locker 100, arranged in accordance with at least one embodiment described herein. The wavelength locker 100 may form part of an example optical transmitter, such as the optical transmitter 200 of FIG. 3. The wavelength locker 100 may include an etalon 20 that may receive a first beam 11 with linear polarization, e.g., the first beam 11 may include linearly polarized light. Alternately or additionally, the first beam 11 may include both a horizontal polarization component $11x$ and a vertical polarization component $11y$ that, in combination, form the first beam 11 with linear polarization. The etalon 20 may delay the horizontal and vertical polarization components $11x$, $11y$ by different delays and may transmit them to a polarization beam splitter 30.

The polarization beam splitter 30 is positioned in a common beam path of the delayed horizontal and vertical polarization components $11x$, $11y$. Accordingly, the polarization beam splitter 30 may receive the delayed horizontal and vertical polarization components $11x$, $11y$ of the first beam 11 and may separate them onto separate beam paths.

The wavelength locker 100 may further include first and second etalon detectors 41, 42 and a reference detector 43. The first etalon detector 41 is positioned in a first one of the separate beam paths. The second etalon detector 42 is positioned in a second one of the separate beam paths. The reference detector 43 is positioned in a beam path of a portion of an output beam 10 (see FIG. 3).

The first etalon detector 41 may receive the delayed horizontal polarization component $11x$ and may generate a first signal $41x$ that represents a power of the delayed horizontal polarization component $11x$. The foregoing power may be referred to as the "first power."

The second etalon detector 42 may receive the delayed vertical polarization component $11y$ and may generate a second signal $42y$ that represents a power of the delayed vertical polarization component $11y$. The foregoing power may be referred as the "second power."

The reference detector 43 may receive the portion of the output beam 10 (see FIG. 3) and may generate a reference signal $43a$ that represents a power of the output beam 10. One or more of the first etalon detector 41, second etalon detector 42, and reference detector may include a photodiode, such as a positive-intrinsic-negative (pin) photodiode.

The wavelength of the first beam 11 may be determined based on a ratio of the first signal $41x$ to the second signal $42y$. Alternately or additionally, the wavelength of the first beam 11 may be determined based on a ratio of a normalized first signal and a normalized second signal. The normalized first signal may be generated by dividing the first signal $41x$ by the reference signal $43a$. Alternately or additionally, the normalized second signal may be generated by dividing the second signal $42y$ by the reference signal $43a$.

The etalon 20 of FIG. 1 is shown in both an assembled form (bottom left in FIG. 1) and disassembled form (top left of FIG. 1). The wavelength locker 100 of FIG. 1 should not be interpreted as including two different etalons 20. The etalon 20 may include a first birefringent crystal 21 having a first optical axis $21x$ coupled to a second birefringent crystal 22 having a second optical axis $22y$. The first birefringent crystal 21 may be directly physically coupled to the second birefringent crystal 22. Alternately, the first birefringent crystal 21 may be optically coupled to the second birefringent crystal 22 by an index matching element positioned between the first birefringent crystal 21 and the second birefringent crystal 22. In some embodiments, the first optical axis $21x$ may be orthogonal to the second optical axis $22y$. A Free Spectral Range (FSR) of the combination of the first birefringent crystal 21 and the second birefringent crystal 22 for the delayed horizontal polarization component $11x$ may be equal to an FSR of the combination of the first birefringent crystal 21 and the second birefringent crystal 22 for the delayed vertical polarization component $11y$. In some embodiments, the FSR of the combined first and second birefringent crystals 21, 22, or more generally of the etalon 20, may be 50 gigahertz (GHz). In other embodiments, the FSR of each of the first and second birefringent crystals or more generally of the etalon 20, may be 100 GHz or some other FSR.

Figure 2:
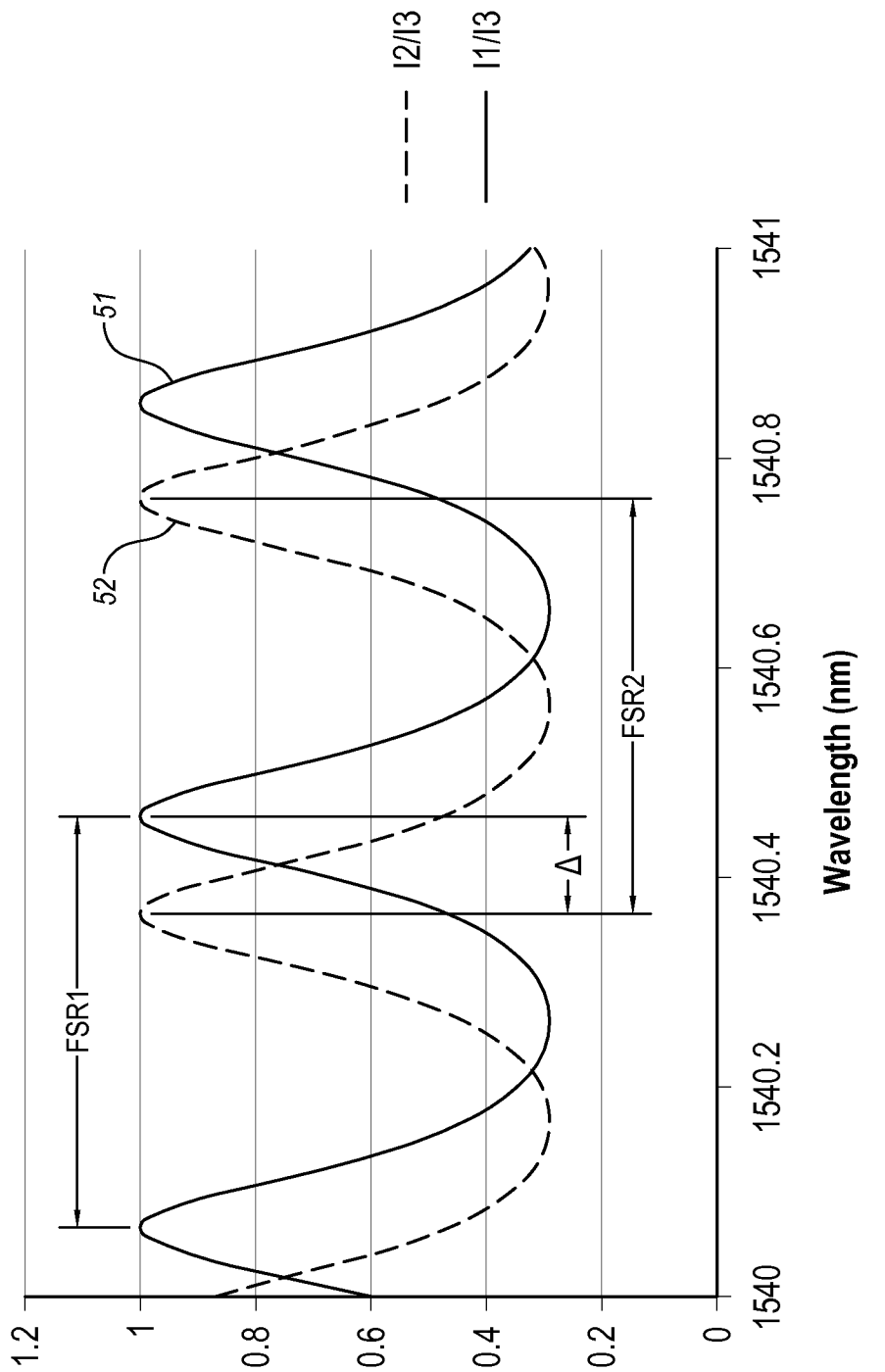
FIG. 2 is a graph that includes a first tuning curve that represents a first normalized signal and a second tuning curve that represents a second normalized signal, both associated with the etalon of FIG. 1.

FIG. 2 is a graph that includes a first tuning curve 51 that represents a first normalized signal and a second tuning curve 52 that represents a second normalized signal, both associated with the etalon 20 of FIG. 1, arranged in accordance with at least one embodiment described herein. In FIG. 2, normalized power (vertical axis) is plotted as a function of wavelength (horizontal axis).

The first tuning curve 51 is a model of the first normalized signal (e.g., the first signal 41x divided by the reference signal 43a) as the wavelength of the first beam 11 is adjusted continuously from 1540 nanometers (nm) to 1541 nm. Analogously, the second tuning curve 52 is a model of the second normalized signal (e.g., the second signal 42y divided by the reference signal 43a) as the wavelength of the first beam 11 is adjusted continuously from 1540 nanometers (nm) to 1541 nm.

Each of the first and second tuning curves 51, 52 has periodic transmission peaks separated by periodic transmission valleys with sloped portions therebetween. More light is transmitted through the corresponding first or second birefringent crystal for light with wavelengths at the transmission peaks than for light with wavelengths at the transmission valleys.

FIG. 2 further illustrates an FSR of the etalon 20 for each of the delayed horizontal and vertical polarization components 11x, 11y. In particular, a first FSR is equal to peak-to-peak separation of the first tuning curve 51 and is labeled in FIG. 2 as FSR1. Analogously, a second FSR is equal to periodic peak-to-peak separation of the second tuning curve 52 and is labeled in FIG. 2 as FSR2. In some embodiments, FSR1 and FSR2 are equal. Alternately or additionally, one or both of FSR1 and FSR2 may be 50 GHz or 100 GHz or other suitable FSR.

As further illustrated in FIG. 2, the transmission peaks of the horizontal polarization component 11x may be offset from the peaks of vertical polarization component 11y by a value of approximately $\frac{1}{4}^{th}$ of the FSR of the horizontal polarization component 11x, labeled as $\Delta$ in FIG. 2. The offset ensures any change in wavelength can be detected relatively easily.

In more detail, for a given one of the first or second tuning curves 51, 52 considered by itself, when the wavelength of the first beam 11 is at or near one of the transmission peaks or transmission valleys, it may be relatively difficult to detect a change in wavelength of the first beam 11 since the change in wavelength may not cause much, if any, of a change in the value of the corresponding first or second tuning curve 51, 52. On the other hand, and for a given one of the first or second tuning curves 51, 52 considered by itself, when the wavelength of the first beam 11 is on one of the sloped portions, it may be relatively easy to detect a change in wavelength of the first beam 11 since the change in wavelength may cause a significant change in the value of the corresponding first or second tuning curve. The offset of the transmission peaks of the horizontal and vertical polarization components 11x, 11y ensures that the wavelength of the first beam 11 will always be on a sloped portion of at least one of the first and second tuning curves 51, 52. Accordingly, the first beam 11 (and thus the output beam 10) tuned according to the etalon 20 may be modified to any wavelength between two ITU grids (i.e., gridless).

Returning to FIG. 1, the first beam 11 may have a linear polarization of approximately 45 degrees, or more generally a linear polarization in a range between 40 and 50 degrees. In some embodiments, the first birefringent crystal 21 may have its optical axis 21x aligned perpendicular to the polarization of the horizontal polarization component 11x and the second birefringent crystal 22 may have its optical axis 22y aligned parallel to the polarization of the horizontal polarization component 11x. In other embodiments, the first birefringent crystal 21 may have its optical axis 21x aligned parallel to the polarization of the horizontal polarization component 11x and the second birefringent crystal 22 may have its optical axis 22y aligned perpendicular to the polarization of the horizontal polarization component 11x. In both of the foregoing configurations, the horizontal and vertical polarization components 11x, 11y may experience different delays as the first beam 11 travels through the etalon 20.

The different delays may arise from providing the first and second birefringent crystals 21, 22 with different thicknesses, determined as follows. The optical path length of the horizontal polarization component 11x through the etalon 20 may be determined according to equation 1, whereas the optical path length of the vertical polarization component 11y through the etalon 20 may be determined according to equation 2:

$$OPL1 = L_1 * n_o * \cos(\theta_o) + L_2 * n_e * \cos(\theta_e) \qquad \text{eq. 1.}$$

$$OPL2 = L_2 * n_o * \cos(\theta_o) + L_1 * n_e * \cos(\theta_e) \qquad \text{eq. 2.}$$

In the foregoing equations, OPL1 is the optical path length of the horizontal polarization component 11x through the etalon 20, OPL2 is the optical path length of the vertical polarization component 11y through the etalon 20, $L_1$ is a thickness of the first birefringent crystal 21, $L_2$ is a thickness of the second birefringent crystal 22, $n_o$ is an index of refraction when the polarization of the horizontal or vertical polarization component 11x, 11y is perpendicular to the optical axis 21x, 22y of the first or second birefringent crystal 21, 22 for ordinary light, $n_e$ is an index of refraction when the polarization of the horizontal or vertical polarization component 11x, 11y is parallel to the optical axis 21x, 22y of the first or second birefringent crystal 21, 22 for extraordinary light, $\theta_o$ is an angle within the first or second birefringent crystal 21, 22 between a propagation direction of ordinary light and a line normal to a front surface of the first or second birefringent crystal 21, 22, and $\theta_e$ is an angle within the first or second birefringent crystal 21, 22 between a propagation direction of extraordinary light and a line normal to a front surface of the first or second birefringent crystal 21 and 22.

The FSR of etalon 20 may be defined according to equation 3:

$$FSR = 2c/(OPL1 + OPL2) \qquad \text{eq. 3.}$$

In equation 3, c is the speed of light and OPL1 and OPL2 are defined by equations 1 and 2 above. Here, FSR may represent the average FSR of the horizontal and vertical polarization components 11x, 11y, which may be expressed as (FSR1+FSR2)/2. The difference between FSR1 and FSR2 may be negligible if the difference between OPL1 and OPL2 is smaller than the wavelength of the first beam 11.

As previously mentioned in the discussion of FIG. 2, the peaks of the horizontal polarization component 11x may be offset from the peaks of the vertical polarization component 11y by a value of approximately $\frac{1}{4}^{th}$ of the FSR of the horizontal or vertical polarization component 11x, 11y, as represented by equation 4:

$$OPL1 - OPL2 = \frac{1}{4} * \lambda_c \qquad \text{eq. 4,}$$

where $\lambda_c$ is a center wavelength of a wavelength band of interest. In an example embodiment, $\lambda_c$ is a center wavelength of the C-band, e.g., the wavelength range from 1530 nanometers (nm) to 1565 nm.

From equations 1-4, and for a given nominal incident angle, crystal material, and FSR, $L_1$ and $L_2$ can be solved. For quartz and an FSR of 50 GHz, $L_1$ and $L_2$ may each be approximately 1 millimeter (mm). For an offset of 12.5 GHz, $L_1$-$L_2$ may be about 0.02 mm.

Accordingly, the first and second birefringent crystals 21, 22 may be approximately identical, having a difference in thickness of approximately 20 micrometers. The first birefringent crystal 21 may have a thickness of approximately 1 millimeter. In some embodiments, the second birefringent crystal 22 may have a thickness of approximately 0.980 millimeters. In other embodiments, the second birefringent crystal 22 may have a thickness of approximately 1.02 millimeters. Alternatively, the first birefringent crystal 21 may have a thickness of approximately 0.980 millimeters or 1.02 millimeters and the second birefringent crystal may have a thickness of approximately 1 millimeter. The size of the etalon 20 may therefore measure approximately half the size of a typical prior art double etalon assembly, as described above.

In these and other embodiments, the first and second birefringent crystals 21, 22 may be formed from quartz, ruby ($Al_2O_3$), sapphire ($Al_2O_3$), silicon carbide (SiC), or any other suitable birefringent material.

Figure 3:
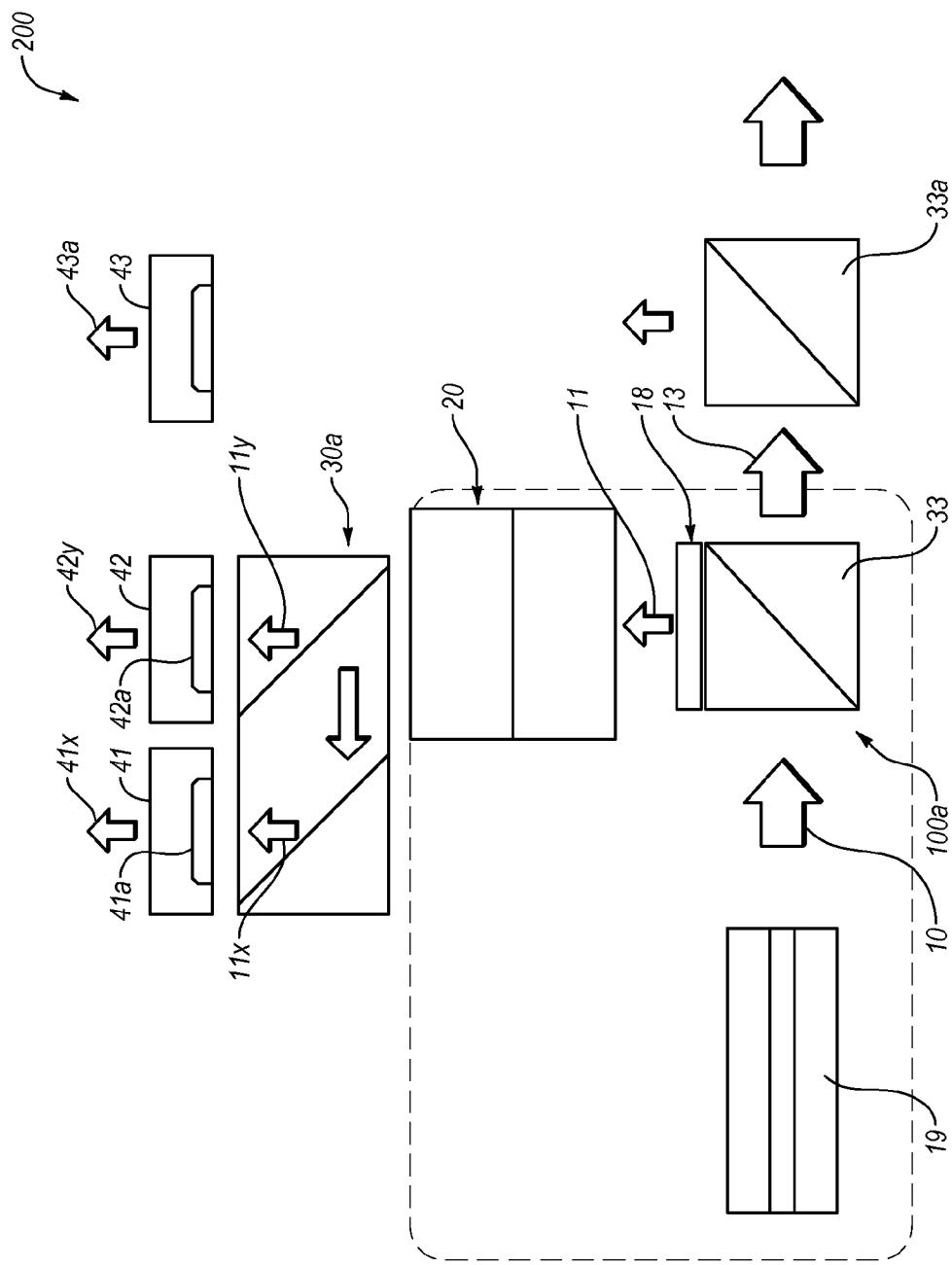
FIG. 3 illustrates a schematic view of an optical transmitter that includes an optical light source, a tap beam splitter, a half-wave plate, and a wavelength locker.

FIG. 3 illustrates a schematic view of an example optical transmitter 200 that includes an optical light source 19, a tap beam splitter 33, a half-wave plate 18, and a wavelength locker 100a, arranged in accordance with at least one embodiment described herein. The wavelength locker 100a may be similar or identical to the wavelength locker 100 of FIG. 1 and the use of similar or identical reference numbers in FIG. 3 denotes components that are similar or identical to the corresponding components of FIG. 1.

The optical light source 19 may include a semiconductor laser or other suitable light source that emits linearly polarized light. In some embodiments, the optical light source 19 includes an edge-emitting semiconductor laser such as a distributed Bragg reflector (DBR) laser. The optical light source 19 may emit the output beam 10 mentioned previously.

Although not illustrated in FIG. 3, the optical light source 19 may be coupled to (e.g., mounted on or otherwise coupled to) a thermoelectric cooler (TEC). The TEC may be configured to maintain the optical light source 19 and etalon 20 at a predetermined operating temperature. In some embodiments, a wavelength of light emitted by the optical light source 19 may be at least partially controlled by laser bias circuits (not shown) electrically coupled to the optical light source 19 by, e.g., increasing or decreasing a bias signal provided to the optical light source 19. Accordingly, the laser bias circuits may tune the optical light source 19 to a desired operating wavelength. Alternately or additionally, the laser bias circuits may adjust the bias signal provided to the optical light source 19 up or down responsive to a feedback signal generated by a feedback loop that includes the wavelength locker 100a to adjust the wavelength of the optical light source 19 toward a target wavelength.

The tap beam splitter 33 is positioned in a beam path of the output beam 10 and may split the output beam 10 into a second beam (not labeled) and a third beam 13. In some embodiments, the second beam may include approximately 5% or less of the output beam 10. The third beam 13 may include a remainder of the output beam 10 less any losses from the tap beam splitter 33. The output beam 10, and thus the second beam and the third beam 13, may have a single linear horizontal polarization. The third beam 13 may generally continue to an optical network.

Alternately or additionally, the optical transmitter 200 may further include a second tap beam splitter 33a positioned in a beam path of the third beam 13. The second tap beam splitter 33a may redirect a portion, e.g., 5% or less, of the third beam 13 to the reference detector 43. The reminder of the third beam 13 less any losses from the second tap beam splitter 33a may continue to the optical network.

The half-wave plate 18 may be configured to shift the polarization direction of the second beam tapped from the output beam 10. More particularly, the half-wave plate 18 may shift the single linear polarization of the second beam to a linear polarization of approximately 45 degrees, or more generally a linear polarization in a range between 40 and 50 degrees, resulting in the first beam 11 that exits the half-wave plate 18. Accordingly, the first beam 11 may include both vertical and horizontal polarization components as described previously.

The wavelength locker 100a includes the etalon 20, a polarization beam splitter 30a, the first and second etalon detectors 41, 42, and the reference detector 43. The polarization beam splitter 30a is similar in many respects to the polarization beam splitter 30 of FIG. 1, except that the polarization beam splitter 30a has parallel outputs whereas the polarization beam splitter 30 of FIG. 1 has orthogonal outputs. In other embodiments, the wavelength locker 100a implemented in FIG. 3 may include the polarization beam splitter 30 of FIG. 1 or other suitable polarization beam splitter.

The first beam 11 may be transmitted toward the etalon 20 of the wavelength locker 100a and may generally be processed as already described above in the context of FIG. 1. Accordingly, the wavelength locker 100a may use the first beam 11 to tune and lock the wavelength of the output beam 10 according to the method of use detailed below. In some embodiments, a controller (not shown) may be used to continuously monitor the horizontal and vertical polarization components $11x$, $11y$ or a ratio thereof, or corresponding first and second normalized signals or a ratio thereof, and correspondingly adjust the wavelength of the output beam 10 to maintain a target wavelength.

Modifications, additions, or omissions may be made to the components of the optical transmitter 200 illustrated in FIG. 3 without departing from the scope of the present disclosure.

In an example method of use of an optical transmitter, such as the optical transmitter 200 of FIG. 3, the output beam 10 is transmitted through the tap beam splitter 33, which may transmit a portion of the output beam 10 through the half-wave plate 18 to shift its linear polarization to approximately 45 degrees, or more generally a linear polarization in a range between 40 and 50 degrees. The first beam 11 that exits the half-wave plate 18 may then be transmitted through the etalon 20, where the horizontal polarization component $11x$ and the vertical polarization component $11y$ experience slightly different delays. The horizontal and vertical polarization components $11x$, $11y$ may be transmitted to the polarization beam splitter 30a to be redirected to, respectively, the first and second etalon detectors 41, 42. The first signal $41x$ may be generated that represents the power of the horizontal polarization component $11x$ and the second signal $42y$ may be generated that represents the power of the vertical polarization component $11y$. The reference signal $43a$ that represents the power of the output beam 10 may be generated by the reference detector 43 positioned to receive the portion of the third beam from the second tap beam splitter 33a. The normalized first signal and the normalized second signal may be generated by, respectively, dividing the first signal $41x$ and the second signal $42y$ by the reference signal $43a$. The wavelength of the first beam 11 (and thus of the output beam 10) may be determined by a ratio of the normalized first signal and the normalized second signal. Alternately or additionally, the wavelength of the first beam 11 (and thus of the output beam 10) may be determined by a ratio of the first signal 41x and the second signal 42y. The wavelength of the output beam 10 may then be adjusted according to the determined wavelength of the first beam 11, for example by controlling the laser bias circuits to adjust the wavelength of the optical light source 19 toward a target wavelength.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical transmitter comprising:
an etalon positioned in a beam path of a light beam, the etalon comprising:
a first birefringent crystal having a first optical axis; and
a second birefringent crystal having a second optical axis,
wherein the first birefringent crystal is coupled to the second birefringent crystal such that the first optical axis and the second optical axis are orthogonal to one another; and
wherein the etalon is configured to receive the light beam that simultaneously has both a horizontal polarization component and a vertical polarization component;
wherein the horizontal polarization component and the vertical polarization component of the light beam experience different delays as the light beam travels through the etalon; and
a polarization beam splitter positioned in a common beam path of the delayed horizontal and vertical polarization components received from the etalon, the polarization beam splitter configured to separate the delayed horizontal and vertical polarization components onto separate beam paths;
a first etalon detector positioned in a first one of the separate beam paths and configured to receive the delayed horizontal polarization component; and
a second etalon detector positioned in a second one of the separate beam paths and configured to receive the delayed vertical polarization component.

2. The etalon of claim 1, wherein the etalon has a Free Spectral Range (FSR) of approximately 50 gigahertz (GHz) or 100 GHz for the horizontal and vertical polarization components.

3. The etalon of claim 2, wherein transmission peaks of the horizontal polarization component through the etalon are offset from transmission peaks of the vertical polarization component through the etalon by a value of about $1/4^{th}$ of the FSR.

4. The etalon of claim 2, wherein the FSR is approximately 50 GHz and the first birefringent crystal has a thickness of approximately 1 millimeter.

5. The etalon of claim 4, wherein the second birefringent crystal has a thickness of approximately 0.980 millimeter.

6. The etalon of claim 4, wherein the second birefringent crystal has a thickness of approximately 1.02 millimeter.

7. The etalon of claim 1, wherein the first and second birefringent crystals comprise quartz.

8. An optical transmitter comprising:
an optical light source configured to emit an output beam;
a first beam splitter positioned in a beam path of the output beam, the first beam splitter configured to split the output beam into a first beam and a second beam;
a waveplate positioned in a beam path of the second beam, the waveplate configured to polarize the second beam to generate a third beam having a linear polarization in a range between 40 and 50 degrees; and
an etalon positioned in a beam path of the third beam, the etalon including a first birefringent crystal having a first optical axis and a second birefringent crystal having a second optical axis, wherein the first and second birefringent crystals are coupled together such that the first optical axis and the second optical axis are orthogonal to one another;
wherein a horizontal polarization component and a vertical polarization component of the third beam experience different delays as the third beam travels through the etalon; and
the optical transmitter further comprises:
a polarization beam splitter positioned in a common beam path of the delayed horizontal and vertical polarization components received from the etalon, the polarization beam splitter configured to separate the delayed horizontal and vertical polarization components onto separate beam paths;
a first etalon detector positioned in a first one of the separate beam paths and configured to receive the delayed horizontal polarization component; and
a second etalon detector positioned in a second one of the separate beam paths and configured to receive the delayed vertical polarization component.

9. The optical transmitter of claim 8, wherein the first etalon detector comprises a first photodiode and the second etalon detector comprises a second photodiode.

10. The optical transmitter of claim 8, further comprising a reference detector positioned in a beam path of a portion of the first beam and configured to generate a reference signal to normalize each of a first signal generated by the first etalon detector and a second signal generated by the second etalon detector.

11. The optical transmitter of claim 8, wherein the optical light source comprises a semiconductor laser coupled to a thermoelectric cooler (TEC) configured to maintain the semiconductor laser at a predetermined operating temperature.

12. The optical transmitter of claim 8, wherein the first beam splitter comprises a tap beam splitter.

13. The optical transmitter of claim 8, wherein the third beam has a linear polarization of 45 degrees.

14. A method of wavelength locking, the method comprising:
transmitting a first beam that simultaneously includes both a horizontal polarization component and a vertical polarization component through an etalon, wherein:
the horizontal polarization component and the vertical polarization component experience different delays through the etalon;
the etalon includes a first birefringent crystal having a first optical axis and a second birefringent crystal having a second optical axis; and
the first and second birefringent crystals are coupled together such that the first optical axis and the second optical axis are orthogonal to one another;
generating a first signal that represents a first power of the delayed horizontal polarization component;

generating a second signal that represents a second power of the delayed vertical polarization component; and determining a wavelength of the first beam based on a ratio of the first signal and the second signal or based on a ratio of a normalized first signal and a normalized second signal.

15. The method of claim 14, wherein the delayed horizontal and vertical polarization components exit the etalon on a common beam path, the method further comprising:

prior to transmitting the first beam through the etalon, splitting an output beam of an optical light source into a second beam and a third beam and polarizing the second beam to generate the first beam with the horizontal and vertical polarization components;

prior to generating the first signal and the second signal, separating the delayed horizontal and vertical polarization components on the common beam path onto separate beam paths;

generating a reference signal that represents a power of the output beam of the optical light source;

dividing the first signal by the reference signal to generate the normalized first signal;

dividing the second signal by the reference signal to generate the normalized second signal, wherein the wavelength is determined based on the ratio of the normalized first signal and the normalized second signal; and based on the determined wavelength that indicates a wavelength of the output beam, adjusting the wavelength of the output beam toward a target wavelength.

16. The method of claim 14, wherein the etalon has a first Free Spectral Range (FSR) of approximately 50 GHz or 100 GHz for the horizontal polarization component and the second signal has a second FSR that is equal to the first FSR.

17. The method of claim 14, wherein a first Free Spectral Range (FSR) of the etalon for the horizontal polarization component is equal to a second FSR of the etalon for the vertical polarization component and wherein transmission peaks of the horizontal polarization component through the etalon are offset from transmission peaks of the vertical polarization component through the etalon by a value of about $1/4^{th}$ of the first FSR.

18. The method of claim 14, wherein the first beam has a linear polarization of 45 degrees.

19. The method of claim 15, further comprising:

transmitting the output beam of the optical light source through a tap beam splitter to generate the second beam and the third beam, wherein the second beam includes less than about 5% of the output beam and wherein the output beam, the second beam, and the third beam have a single linear horizontal polarization; and transmitting the second beam through a half-wave plate to change the single linear horizontal polarization of the second beam to 45 degree polarization such that transmitting the second beam through the half-wave plate generates, from the second beam, the first beam with the vertical and horizontal polarization components.

\* \* \* \* \*